United States Patent
Miyazaki

(10) Patent No.: US 8,860,446 B2
(45) Date of Patent: Oct. 14, 2014

(54) MULTIPLE CONTACT TEST PROBE

(75) Inventor: Hiroshi Miyazaki, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 370 days.

(21) Appl. No.: 13/479,579

(22) Filed: May 24, 2012

(65) Prior Publication Data

US 2013/0314114 A1 Nov. 28, 2013

(51) Int. Cl.
*G01R 31/20* (2006.01)

(52) U.S. Cl.
USPC .............. 324/754.03; 324/755.05; 29/602.1; 439/269; 439/324

(58) Field of Classification Search
USPC .................................. 324/754.03
See application file for complete search history.

(56) References Cited

U.S. PATENT DOCUMENTS

| | | | | |
|---|---|---|---|---|
| 4,054,988 A | * | 10/1977 | Masuzima et al. | 29/564.6 |
| 4,277,663 A | * | 7/1981 | Soes | 200/283 |
| 4,746,299 A | * | 5/1988 | Matsuoka et al. | 439/70 |
| 4,887,347 A | * | 12/1989 | Hikita | 29/602.1 |
| 4,931,726 A | * | 6/1990 | Kasukabe et al. | 324/755.05 |
| 5,078,412 A | * | 1/1992 | Baumgarth | 277/345 |
| 6,296,505 B1 | * | 10/2001 | Fukunaga et al. | 439/268 |
| 6,791,345 B2 | * | 9/2004 | Maruyama et al. | 324/754.08 |
| 7,878,834 B2 | * | 2/2011 | Sherman et al. | 439/324 |
| 8,669,774 B2 | * | 3/2014 | Kato et al. | 324/755.05 |
| 2006/0192264 A1 | * | 8/2006 | Takahashi et al. | 257/459 |
| 2009/0271997 A1 | * | 11/2009 | Ruck et al. | 33/503 |
| 2010/0271061 A1 | * | 10/2010 | Yamamoto | 324/757 |
| 2011/0248736 A1 | * | 10/2011 | Kato et al. | 324/755.05 |

* cited by examiner

*Primary Examiner* — Benjamin M Baldridge
(74) *Attorney, Agent, or Firm* — Steven A. Shaw; Frederick J. Telecky, Jr.

(57) ABSTRACT

A probe apparatus may include a plurality of probe pins attached to a probe head portion. Each of the probe pins may be independently movable relative to the probe head portion.

20 Claims, 3 Drawing Sheets

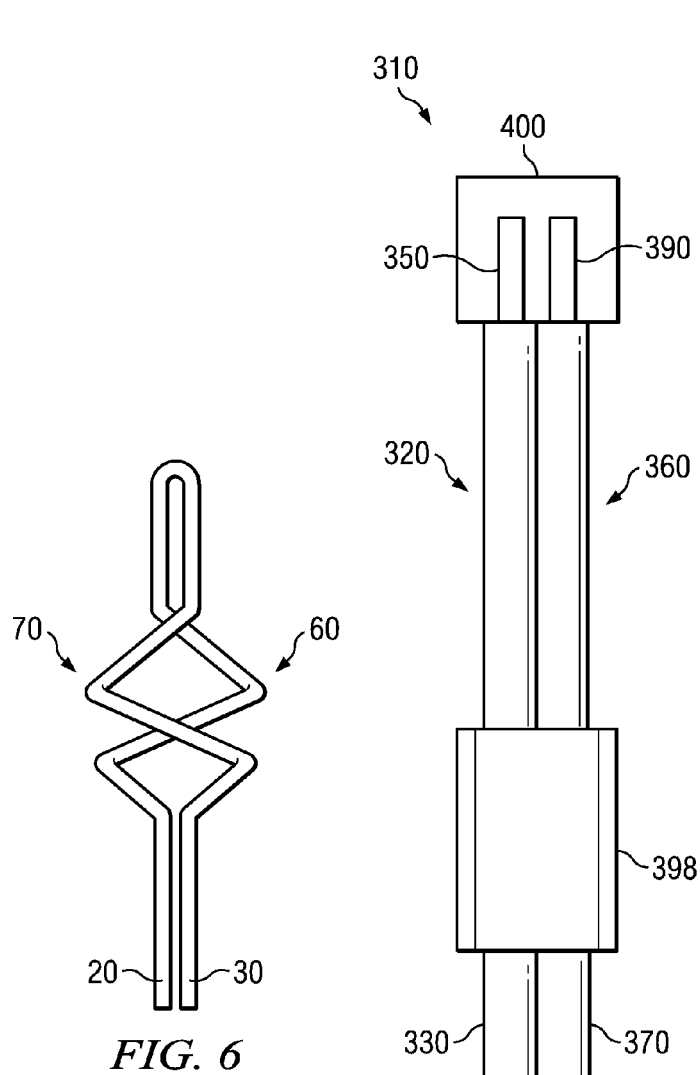
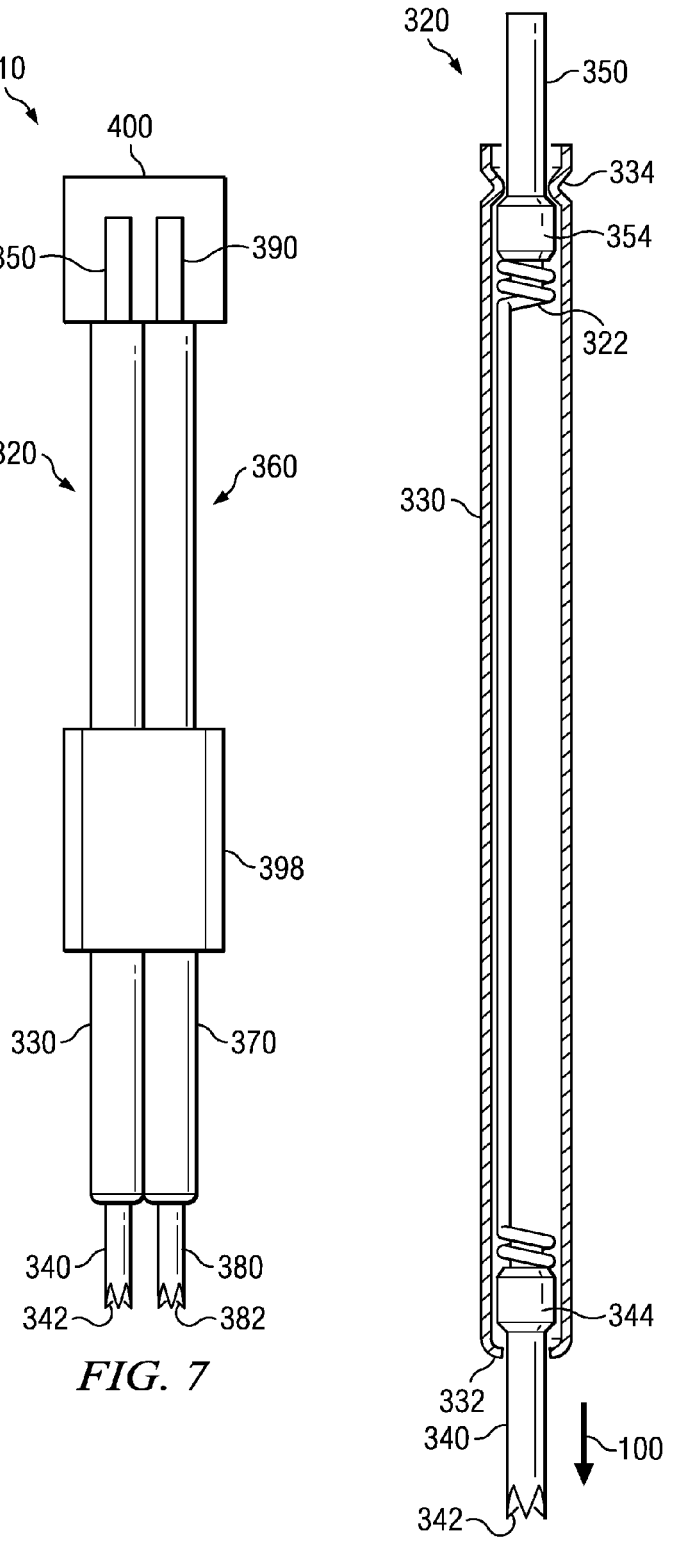
FIG. 6
FIG. 7
FIG. 8

MULTIPLE CONTACT TEST PROBE

BACKGROUND

Typical integrated circuit devices contain multiple printed circuit layers. Each layer is insulated from its adjacent layer except where interlayer connections are selectively created. The individual circuit layers of an integrated circuit device are typically created by a photolithographic process. Each layer is formed on an integrated circuit device during a separate trip through the photolithographic manufacturing area. After each trip, the integrated circuit device is transported to other manufacturing areas where additional processing steps, such as etching and deposition, are performed. Thereafter, the integrated circuit device is returned to the photolithographic process manufacturing area so that an additional circuit layer may be applied. The process is then repeated until the desired number of circuit layers has been created.

During the manufacture of integrated circuit devices, several devices are typically formed on a single silicon substrate which is commonly referred to in the industry as a "wafer". A single wafer may, for example, contain well over 100 integrated circuit devices. When the manufacture of the integrated circuit devices on a wafer is completed, the wafer is sawn apart such that the integrated circuit devices contained thereon are separated into individual units.

It is often desirable to test integrated circuit devices and other types of electronic devices (e.g., printed circuit boards, printed wiring boards). To perform such testing, one or more probes (sometimes also referred to as "pins") are typically brought into contact with the electrical input/output contacts or "lands" of a device. In order to ensure that each probe makes reliable contact with its corresponding contact on the device, probes are typically designed to have some degree of resiliency. This resiliency helps to ensure that each probe makes contact with its corresponding contact while avoiding the need to apply an overly large level of force to the probe card.

A problem sometimes occurs during testing of electronic devices when foreign material (i.e., a contaminant) is located on a land of the device. When this happens, the foreign material may prevent the probe from making contact with the land, thus disrupting electrical continuity between the land and the test probe. This is generally known as a "non-contact" issue or fault. Examples of foreign materials that may be present on the lands include debris or particles from packaging materials.

One known solution to the problem described above is to provide a probe having a relatively sharp contact end. Providing such a sharp contact end allows the probe to pierce or cut through a contaminant that may be present in the land area being tested in most cases. This solution, however, has been found to be problematic in that the sharp contact end sometimes damages the land area on the electronic device, thus resulting in degradation in reliability for the electronic device.

BRIEF DESCRIPTION OF THE DRAWINGS

FIG. 6 is a front elevation view of the portion of the exemplary probe device of FIGS. 4 and 5 in a still further intermediate stage of manufacture.

FIG. 7 is a front elevation view of an alternative exemplary probe device having a pair of probe assemblies.

FIG. 8 is front elevation cross-sectional view of one of the probe assemblies of the alternative exemplary probe device of FIG. 7.

DETAILED DESCRIPTION

Figure 1:
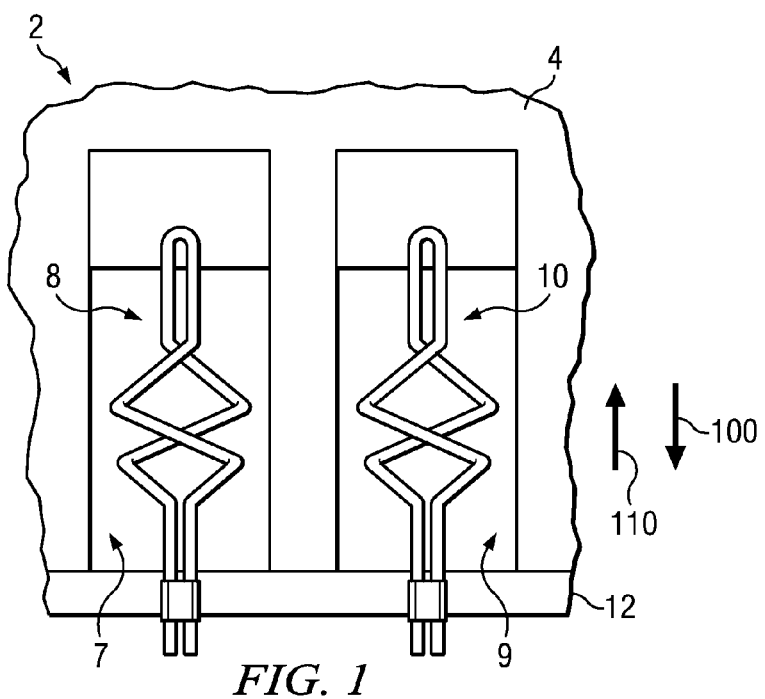
FIG. 1 is a schematic front elevation, partial cut-away view of an exemplary probe apparatus having a probe head with a plurality of probe devices attached thereto.

As discussed above, a problem sometimes occurs during testing of electronic devices when foreign material (i.e., a contaminant) is located on a land of the electronic device. When this happens, the foreign material may prevent the probe from making contact with the land, thus disrupting electrical continuity between the land and the test probe. FIG. 1 illustrates a probe apparatus 2 which is configured to alleviate this problem.

With reference to FIG. 1, the probe apparatus 2 may generally include a probe head 4 having a plurality of recesses 7 and 9 formed therein. A plurality of probe devices 8 and 10 may be housed within each of the recesses 7 and 9, respectively. The probe head 4, along with the probe devices 8, 10, is movable in the directions 100, 110 to enable the probe devices 8, 10 to be brought into contact with the lands of an electronic device to be tested. It is noted that, for purposes of illustrative clarity, only two probe devices (i.e., the probe devices 8 and 10) are shown in FIG. 1. It is to be understood, however, that the probe head 4 may actually contain many more probe devices (e.g., a number of probe devices equal to the number of lands on the particular electronic device being tested). Although not illustrated in FIG. 1, each of the probe devices 8, 10 may be provided with electrical connections within the probe head 4 as necessary to effectuate testing, as will be readily appreciated by one skilled in the relevant art.

Figure 2:
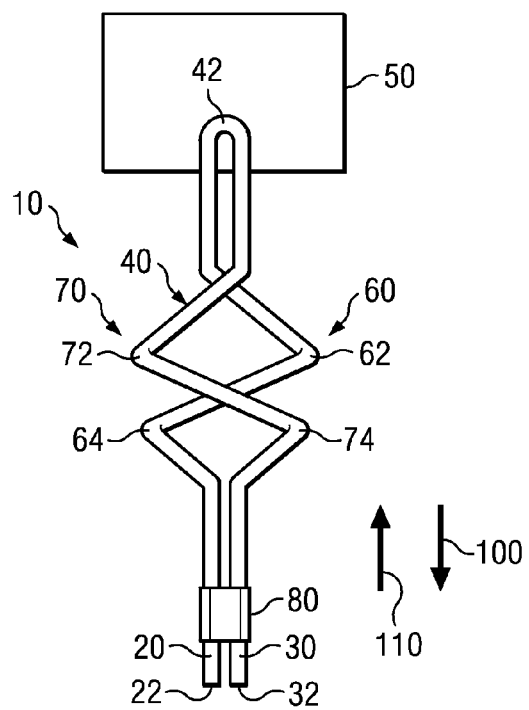
FIG. 2 is a front elevation view of one of the probe devices of FIG. 1

FIG. 2 illustrates the probe device 10 in further detail, it being understood that the remaining probe devices attached to the probe head 4 may be configured in a similar manner. With reference now to FIG. 2, it can be seen that the probe device 10 may include a pair of probe pins 20 and 30, each terminating in a contact surface 22, 32, respectively. Probe pins 20, 30 may be formed from a single wire 40 that is shaped into a predetermined configuration, as will be described in further detail herein. In general terms, the wire 40 may be shaped to include an upper U-shaped bend portion 42, as shown. The U-shaped bend portion 42 may be received within a portion 50 of a probe head in a conventional manner such that electrical continuity is established between the U-shaped bend portion 42 and the portion 50 of the probe head.

The probe pin 20 may be resiliently biased in the direction 100 by a first spring portion 60 which is formed by a pair of bends 62, 64 formed in the wire 40. In a similar fashion, the probe pin 30 may be resiliently biased in the direction 100 by a second spring portion 70 which is formed by a pair of bends 72, 74 formed in the wire 40. A collar 80 may be located as shown in order to hold the probe pins 20 and 30 in close proximity to one another. With reference to FIG. 1, the collar 80 may be attached to a lower plate member 12 which substantially closes the lower ends of the recesses 7 and 9.

Figure 3:
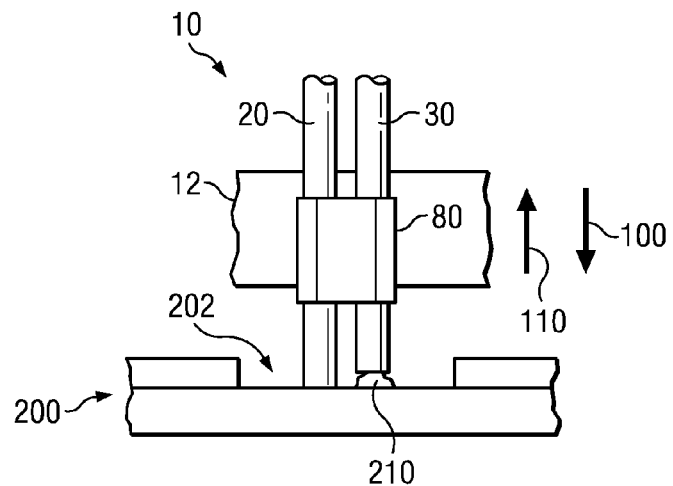
FIG. 3 is a front elevation detail view of a portion of the exemplary probe device of FIG. 2 being used to test an electronic device.

FIG. 3 schematically illustrates the probe device 10 being used to test an electronic device 200. Specifically, the probe device 10 is being used to establish electrical contact with a land 202 of the electronic device 200. In order to carry out this testing, the probe head 4 (FIG. 1) is first moved to a position in which the probe device 10 is overlying the land 202. Next, the probe head 4 is lowered in the direction 100 in order to effect electrical contact with the land 202.

With reference to FIG. 3, it can be seen, however, that a contaminant 210 is located within the land 202. As previously discussed, such a contaminant might prevent a conventional probe device from making contact with the land 202. As can be seen from FIG. 3, however, the design of the probe device 10 allows the probe pin 30, which is in contact with the contaminant 210, to deflect upwardly, i.e., in the direction 110, against the bias of the second spring portion 70, FIG. 2. This deflection of the probe pin 30, in turn, allows the probe pin 20 to continue downwardly, i.e., in the direction 100, and make contact with the land 202 of the electronic device.

Accordingly, the design of the probe device 10 ensures that the device will make contact and establish electrical continuity with the land of an electronic device being tested even when a contaminant may be present in the land area. Further, the probe device 10 accomplishes this goal without the need to resort to a sharp contact tip that might otherwise damage the land area.

Figure 4:
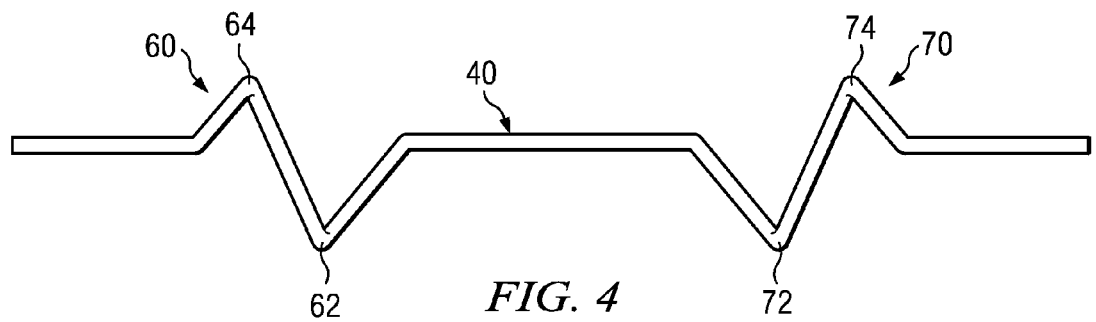
FIG. 4 is a front elevation view of a portion of the exemplary probe device of FIG. 2 in an intermediate stage of manufacture.

Having discussed the features and operation of the probe device 10 above, an exemplary method of making the device will now be described. With reference to FIG. 4, a straight portion of wire may first be bent to form the bends 62 and 64 of the first spring portion 60 and the bends 72 and 74 of the second spring portion 70 to achieve the configuration shown in FIG. 4. The wire may, for example, be formed from a Be—Cu alloy, have a round cross section with a diameter of about 250 um and may have a length (before bending) of about 15 mm.

Figure 5:
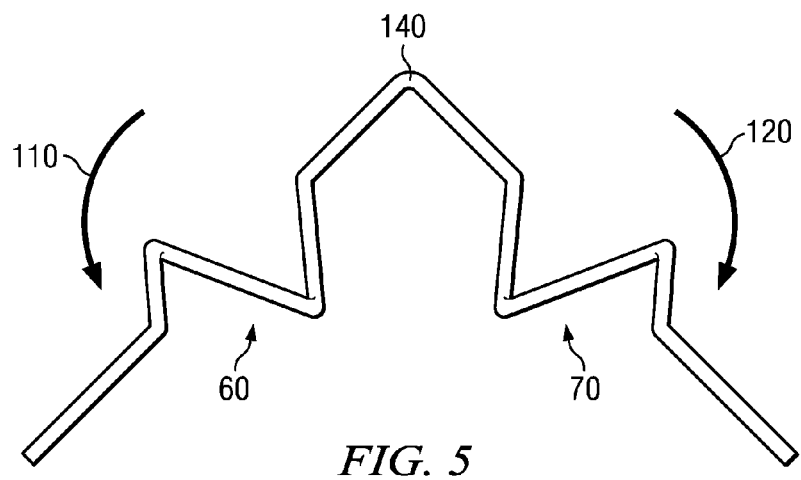
FIG. 5 is a front elevation view of the portion of the exemplary probe device of FIG. 4 in a further intermediate stage of manufacture.

Next, with reference to FIG. 5, the wire may be bent in the directions 110, 120 about a point 140, as shown. This bending may be continued until the upper U-shaped bend portion 42 is fully formed, the second spring portion 70 has passed over the first spring portion 60 and the configuration illustrated in FIG. 6 has been achieved. Next, the collar 80 may be added and the upper U-shaped bend portion 42 may be connected to the portion 50 of the probe head in a conventional manner to achieve the completed configuration shown in FIG. 2. Thereafter, the completed probe device 10 may be inserted into the recess 9 of the probe head 4 (FIG. 1) and the lower plate member 12 may be attached as shown.

FIGS. 7 and 8 illustrate an alternate probe device 310. With reference to FIG. 7, the probe device 310 may include a pair of probe assemblies 320 and 360. The probe assembly 320 may include a probe pin 340 terminating in a contact surface 342. The probe pin 340 may be slidingly received within a first end of a barrel member 330. A projection 350 may extend from the opposite end of the barrel member 330, as shown. The projection 350 may be received within a portion 400 of a probe head in a conventional manner such that electrical continuity is established between the projection 350 and the portion 400 of the probe head.

In a manner similar to the probe assembly 320 described above, the probe assembly 360 may include a probe pin 380 terminating in a contact surface 382. The probe pin 380 may be slidingly received within a barrel member 370. A projection 390 may extend from the opposite end of the barrel member 370, as shown. The projection 370 may be received within the portion 400 of a probe head in a conventional manner such that electrical continuity is established between the projection 370 and the portion 400 of the probe head.

FIG. 8 is a cross-sectional view of the probe assembly 320. It is to be understood that, although not illustrated or described in detail herein, the probe assembly 360 may be constructed in a substantially identical manner to the probe assembly 320. With reference now to FIG. 8, it can be seen that the probe pin 340 may include an integrally-formed enlarged head portion 344 located within the barrel member 330. In a similar manner, the projection 350 may include an integrally-formed enlarged head portion 354. A spring 322 may be compressed between the enlarged head portion 344 and the enlarged head portion 354 in order to bias the probe pin 340 in the direction 100 relative to the barrel member 330. The projection 350 and the probe pin 340 may be formed, for example, from a Be—Cu alloy and the spring 322 may, for example, be formed from steel alloy/gold plate or another electrically conductive material in order to facilitate electrical continuity between the probe pin 340 and the portion 400 of the probe head.

With further reference to FIG. 8, the barrel member 330 may include a reduced diameter portion 332 at its lower end, as shown, in order to prevent the enlarged portion 344 from escaping the barrel member 330. In this manner, the probe pin 340 is slidingly retained within the barrel member 330. The barrel member 330 may further include a crimp 334 formed in its upper end, as shown. The crimp 334 serves to retain the projection 350 in place within the barrel member 330. The barrel member 330 may, for example, be formed from a material such as phosphor bronze/hard gold over nickel.

Having described the probe assembly 320 in detail above, an exemplary manner of constructing and assembling the probe assembly will now be described. With reference again to FIG. 8, the barrel member 330 may first be provided including the reduced diameter portion 332, but without the crimp 334 being in place. Next, the probe pin 340 may be inserted into the barrel member 330 through the upper end thereof and moved into position such that a majority of the probe pin 340 extends through the opening in the reduced diameter portion 332 of the barrel member 330, as shown in FIG. 8. As can be appreciated, contact between the probe pin enlarged head portion 344 and the barrel member reduced diameter portion 332 will prevent the probe pin 340 from escaping the barrel member 330. Next, the spring 322 may be inserted into the barrel member until it contacts the upper side of the probe pin enlarged head portion 344. Thereafter, the projection 350 may inserted into the barrel member 330, in the orientation shown in FIG. 8. With the enlarged head portion 354 of the projection 350 in contact with the upper end of the spring 332, the projection 350 may be moved downwardly (i.e., in the direction 100), thus partially compressing the spring 322 between the enlarged portion 354 of the projection 350 and the enlarged portion 344 of the probe pin 340. While holding the projection 350 in this position, the crimp 334 may be formed in the barrel member 330 in any conventional manner. As can be appreciated, with the crimp 334 in place, the projection 350 will be secured within the barrel member 330.

With reference to FIG. 7, the barrel members 330, 370 may be secured to one another, for example, by an external collar or barrel member 398 encircling the barrel members 330, 370, as shown. The collar 398 may be secured to the barrel members 330, 370, for example, by an adhesive material or by providing an indentation (not shown) in the outer surface of the barrel members 330, 370 into which the collar 398 partially recesses. Further, each of the barrel members 330, 370 may be secured to the portion 400 of the probe head, for example, by adhesive materials or molding resin.

In use, the alternative probe device 310 may function in a manner similar to the probe device 10 described above with respect to FIGS. 1-3. Specifically, for example, the independent biasing of the probe pins 340 and 380 allows one of the probe pins to securely contact a land being tested even if the other probe pin contacts a contaminant. Accordingly, in a manner similar to the probe device 10 previously described, the design of the probe device 310 ensures that the device will make contact and establish electrical continuity with the land of an electronic device being tested even when a contaminant may be present in the land area. Further, the probe device 310 accomplishes this goal without the need to resort to a sharp contact tip that might otherwise damage the land area.

It is noted that, although the exemplary embodiments discussed above have been described as each having two probe pins, a greater number of probe pins (e.g., three or four) could alternatively be provided in order to increase the ability of the device to make contact with a land of an electronic device being tested when contaminants are present.

The foregoing description of specific embodiments has been presented for purposes of illustration and description. The specific embodiments described are not intended to be exhaustive or to suggest a constraint to the precise forms disclosed, and many modifications and variations are possible in light of the above teaching. The illustrated embodiments were chosen and described in order to best explain principles and practical application, to thereby enable others skilled in the art to best utilize the various embodiments with various modifications as are suited to the particular use contemplated. It is intended that the scope of the invention be defined only by the claims appended hereto and their equivalents, except as limited by the prior art.

What is claimed is:

1. A probe device for testing a land on an electronic device during a testing process, said probe device comprising:
   a probe head portion;
   a probe pin assembly attached to said probe head portion having a first probe pin and a second probe pin,
      the first probe pin having a contact surface adapted to contact said land;
      the second probe pin having a contact surface adapted to contact said land;
   wherein, said probe head portion is movable in a first direction to bring said first probe pin and second probe pin into contact with said land and in an opposite second direction in order to move said first probe pin and said second probe pin away from said land; and
   wherein said first probe pin is movable relative to said second probe pin.

2. The probe device of claim 1 and further wherein:
   said first probe pin is movable in said first direction and said second direction independently of said probe head portion and said second probe pin.

3. The probe device of claim 2 and further wherein:
   said first probe pin is biased in said first direction relative to said probe head portion.

4. The probe device of claim 3 and further wherein:
   said first probe pin is biased in said first direction relative to said probe head portion by a spring portion comprising a bent wire.

5. The probe device of claim 3 and further wherein:
   said first probe pin is biased in said first direction relative to said probe head portion by a spring portion comprising a compression spring.

6. The probe device of claim 1 and further wherein:
   said first probe pin and said second probe pin are formed from a unitary portion of wire.

7. The probe device of claim 6 and further wherein:
   said unitary portion of wire comprises a first spring portion adapted to bias said first probe pin in said first direction relative to said probe head portion and a second spring portion adapted to bias said second probe pin in said first direction relative to said probe head portion.

8. A probe apparatus for testing a plurality of lands on an electronic device during a testing process, said probe apparatus comprising:
   a plurality of probe devices attached to a probe head, each of said probe devices adapted to contact one of said plurality of lands; and
   wherein, each of said probe devices comprises:
      a probe head portion;
      a probe pin assembly attached to said probe head portion, having a first probe pin having a contact surface adapted to contact said land; and
      a second probe pin having a contact surface adapted to contact said land;
      wherein, said probe head is movable in a first direction to bring said first probe pin and second probe pin into contact with said land and in an opposite second direction in order to move said first probe pin and said second probe pin away from said land; and
      wherein said first probe pin is movable relative to said second probe pin.

9. The probe apparatus of claim 8 and further wherein:
   said first probe pin is movable in said first direction and said second direction independently of said probe head portion and said second probe pin.

10. The probe apparatus of claim 9 and further wherein:
    said first probe pin is biased in said first direction relative to said probe head portion.

11. The probe apparatus of claim 10 and further wherein:
    said first probe pin is biased in said first direction relative to said probe head portion by a spring portion comprising a bent wire.

12. The probe apparatus of claim 10 and further wherein:
    said first probe pin is biased in said first direction relative to said probe head portion by a spring portion comprising a compression spring.

13. The probe apparatus of claim 8 and further wherein:
    said first probe pin and said second probe pin are formed from a unitary portion of wire.

14. The probe device of claim 13 and further wherein:
    said unitary portion of wire comprises a first spring portion adapted to bias said first probe pin in said first direction relative to said probe head portion and a second spring portion adapted to bias said second probe pin in said first direction relative to said probe head portion.

15. A method of testing a land on an electronic device during a testing process, said method comprising:
    providing a probe pin assembly having:
       a first probe pin having a contact surface adapted to contact said land;
       a second probe pin having a contact surface adapted to contact said land;
    initiating movement of said first probe pin and said second probe pin in a first direction toward said land;
    contacting a contaminant located within said land with said contact surface of said first probe pin, thereby halting movement of said first probe pin;
    continuing movement of said second probe pin in said first direction after movement of said first probe pin has halted.

16. The method of claim 15 and further wherein:
said continuing movement of said second probe pin proceeds until said contact surface of said second probe pin contacts said land.

17. The method of claim 15 and further wherein:
said first probe pin and said second probe pin are attached to a probe head portion; and
said first probe pin is biased in said first direction relative to said probe head portion.

18. The probe device of claim 17 and further wherein:
said first probe pin is biased in said first direction relative to said probe head portion by a spring portion comprising a bent wire.

19. The probe device of claim 17 and further wherein:
said first probe pin is biased in said first direction relative to said probe head portion by a spring portion comprising a compression spring.

20. The probe device of claim 15 and further wherein:
said first probe pin and said second probe pin are formed from a unitary portion of wire.

* * * * *